United States Patent
Rodgers et al.

(10) Patent No.: US 7,580,806 B2
(45) Date of Patent: *Aug. 25, 2009

(54) APPARATUS AND METHOD FOR COMPENSATING CLOCK PERIOD ELONGATION DURING SCAN TESTING IN AN INTEGRATED CIRCUIT (IC)

(75) Inventors: Richard S. Rodgers, Fort Collins, CO (US); Jeffrey R. Rearick, Fort Collins, CO (US); Cory D. Groth, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 31 days.

This patent is subject to a terminal disclaimer.

(21) Appl. No.: 11/389,971

(22) Filed: Mar. 27, 2006

(65) Prior Publication Data

US 2006/0167645 A1 Jul. 27, 2006

Related U.S. Application Data

(62) Division of application No. 10/818,884, filed on Apr. 6, 2004, now Pat. No. 7,079,973.

(51) Int. Cl.
*G01R 31/00* (2006.01)
*G01R 31/14* (2006.01)
*G01R 35/00* (2006.01)
*G01D 18/00* (2006.01)
*G01D 21/00* (2006.01)
*G01P 21/00* (2006.01)

(52) U.S. Cl. .......................... 702/117; 702/89

(58) Field of Classification Search .................. 702/79, 702/89, 106, 117–121, 125, 75, 176; 714/724, 714/726, 731, 733, 700, 798; 324/76.54
See application file for complete search history.

(56) References Cited

U.S. PATENT DOCUMENTS

| 5,254,942 | A | | 10/1993 | D'Souza et al. |
| 5,428,626 | A | | 6/1995 | Frisch et al. |
| 5,703,489 | A | * | 12/1997 | Kuroe .......................... 324/601 |
| 5,933,039 | A | * | 8/1999 | Hui et al. ..................... 327/262 |
| 5,935,256 | A | | 8/1999 | Lesmeister |
| 5,978,942 | A | * | 11/1999 | Rockoff ....................... 714/724 |

(Continued)

FOREIGN PATENT DOCUMENTS

EP 1 584 940 * 10/2005

(Continued)

OTHER PUBLICATIONS

Almy, Thomas, "Making Precise At-Speed Timing Measurements Via Boundary-Scan", *IEEE Custom Integrated Circuits Conference* 1997, 207-209.

(Continued)

*Primary Examiner*—Michael P Nghiem

(57) ABSTRACT

An apparatus and method for compensating clock period elongation during scan testing in an integrated circuit (IC) includes operating a clock associated with the IC at a frequency ($f_{TARGET}$) at which IC operation is sought to be determined, measuring the actual clock period ($T_{CLOCK\_OUT}$) at a clock output, scan testing the IC, measuring the actual clock period ($T_{SCAN\_CLOCK\_OUT}$) at the clock output, determining a delay by calculating the difference between $T_{SCAN\_CLOCK\_OUT}$ and $T_{CLOCK\_OUT}$, and compensating for the delay by increasing the clock frequency during scan test.

8 Claims, 6 Drawing Sheets

U.S. PATENT DOCUMENTS

| | | |
|---|---|---|
| 6,256,760 B1 | 7/2001 | Carron et al. |
| 6,320,436 B1 * | 11/2001 | Fawcett et al. .............. 327/158 |
| 6,442,722 B1 * | 8/2002 | Nadeau-Dostie et al. .... 714/731 |
| 6,484,294 B1 | 11/2002 | Kiyoshige et al. |
| 6,763,485 B2 | 7/2004 | Whetsel |
| 6,907,556 B2 | 6/2005 | Siegel |
| 6,934,921 B1 * | 8/2005 | Gu et al. ........................ 716/6 |
| 6,948,096 B2 | 9/2005 | Parvathala et al. |
| 6,995,554 B2 * | 2/2006 | Loke et al. ............... 324/76.54 |
| 7,079,973 B2 * | 7/2006 | Rodgers et al. ............. 702/117 |
| 7,123,001 B2 * | 10/2006 | Loke et al. ............... 324/76.54 |
| 7,516,379 B2 * | 4/2009 | Rohrbaugh et al. ......... 714/731 |
| 2002/0105337 A1 | 8/2002 | Coates et al. |
| 2002/0157050 A1 | 10/2002 | Whetsel |
| 2002/0184584 A1 * | 12/2002 | Taniguchi et al. ........... 714/726 |
| 2003/0188243 A1 | 10/2003 | Rajan |
| 2004/0085082 A1 * | 5/2004 | Townley ..................... 324/765 |
| 2004/0193981 A1 * | 9/2004 | Clark et al. ................. 714/726 |
| 2005/0222795 A1 | 10/2005 | Rodgers et al. |
| 2005/0229056 A1 * | 10/2005 | Rohrbaugh et al. ......... 714/726 |

OTHER PUBLICATIONS

IBM Technical Disclosure Bulletin, , "NN8006328 Zero Display Set Reset Latch with Edge-Triggered Strobe Control", Jun. 1980, 328-329.

* cited by examiner

APPARATUS AND METHOD FOR COMPENSATING CLOCK PERIOD ELONGATION DURING SCAN TESTING IN AN INTEGRATED CIRCUIT (IC)

CROSS REFERENCE TO RELATED APPLICATION

This application is related to co-pending, commonly assigned U.S. patent application Ser. No. 10/818,866, now U.S. Pat. No. 7,516,379, entitled "CIRCUIT AND METHOD FOR COMPARING CIRCUIT PERFORMANCE BETWEEN FUNCTIONAL AND AC SCAN TESTING IN AN INTEGRATED CIRCUIT (IC)," filed on Apr. 6, 2004, which is hereby incorporated into this document by reference and is a divisional of commonly assigned U.S. patent application Ser. No. 10/818,884, now U.S. Pat. No. 7,079,973, entitled "APPARATUS AND METHOD FOR COMPENSATING CLOCK PERIOD ELONGATION DURING SCAN TESTING IN AN INTEGRATED CIRCUIT (IC), filed on Apr. 6,2004.

BACKGROUND

Integrated circuits (ICs) and, more specifically, application specific integrated circuits (ASICs) are becoming more and more complex, and are operating at ever increasing clock speeds. Accordingly, testing the functionality of integrated circuits is becoming an ever increasing challenge for IC test designers and engineers. Generally, testing an integrated circuit falls into two broad categories, functional testing and structural testing. Functional testing involves stimulating the primary inputs of the integrated circuit and measuring the results at the primary outputs of the integrated circuit. Functional testing exercises the functionality of logic elements within the integrated circuit and is a traditional method to test that the integrated circuit can perform its intended operations. However, the creation of a high-quality functional test for a complex integrated circuit is very labor intensive, and the application of such a functional test requires expensive equipment.

Therefore, to reduce the effort and expense required to test an integrated circuit, structural testing has emerged as an alternative to functional testing. In a structural test, the internal storage elements of the IC are used to control and observe the internal logic. This is generally done by linking the storage elements into a serial shift register when a test mode signal is applied. This technique is referred to as "scan testing." Scan testing is divided into two broad categories, static scan testing (also referred to as DC scan testing) and dynamic scan testing (also referred to as AC scan testing or scan-based delay testing). Generally, scan testing involves providing a scan chain comprising a number of interconnected multiplexers and registers connected to the combinational logic of the integrated circuit. The registers in the scan chain are typically implemented using D flip-flops. The scan chain can be many hundreds of thousands of flip-flops in length, and is generally divided into a smaller number of shorter parallel scan chains, each comprising approximately one hundred to one thousand flip-flops and multiplexers. The actual number depends on the complexity of the logic to be tested.

During DC scan testing, scan data may be clocked into the scan chain at a clock rate significantly slower than the anticipated operating clock rate of the integrated circuit. After the scan data is loaded into the scan chain registers, a primary input state is applied to the combinational logic of the integrated circuit. The combination of the scanned-in present state and the applied primary inputs comprises the test stimulus. The values of the primary outputs are then measured and a single clock cycle (sometimes referred to as a "clock pulse") is executed to capture the response of the circuit to the stimulus. To complete the DC scan test, the values captured in the flip-flops are scanned out of the scan chain. As these values are scanned out of the scan chain, they are compared to the expected data by test equipment to verify the correctness of the combinational logic within the IC. Unfortunately, DC scan testing allows timing-related faults to remain undetected due to the static nature of the test.

Dynamic (AC) scan testing is similar to DC scan testing with the main difference being the execution of two successive clock pulses at the operating frequency of the integrated circuit being tested during the capture period. By executing two successive clock pulses, the first of which launches transitions and the second of which captures the response of the circuit to these transitions, the timing performance of the circuit can be evaluated.

FIG. 1A is a block diagram illustrating a simplified prior art integrated circuit 10. The integrated circuit 10 includes logic 14 and a scan chain 15 formed through the flip-flops 16. The logic 14 comprises the logic elements that determine the operational parameters of the IC 10. Primary inputs 11 are input to the logic 14 while the primary outputs 12 are obtained based on the response of the logic 14 to the present state of the flip-flops 16 and the values of the primary inputs 11. The integrated circuit 10 also includes a scan chain formed by a plurality of flip-flops 16 preceded by a corresponding plurality of multiplexers (not shown in FIG. 1A), in which the present state output (Q) of a flip-flop is input to both the logic 14 and the next flip-flop in the scan chain 15.

FIG. 1B is a block diagram illustrating in further detail the integrated circuit 10 of FIG. 1A. The integrated circuit 10 includes a plurality of D flip-flops, each preceded by a corresponding multiplexer to facilitate the connection of the scan chain 15. This type of scan implementation is referred to as "mux-d scan" and is intended to be illustrative and not limiting. In this example, a pad 18, which is referred to as a "scan-in" (SI) pad, supplies scan input data via connection 48 to a first multiplexer 24. The first multiplexer 24 is responsive to a scan enable signal from pad 22. The scan enable (SE) signal 22 is applied to multiplexers 24, 26 and 27. A clock (CK) signal from pad 21 is applied to flip-flops 31, 32, and 33. When the scan enable signal is high (a logic 1) the scan-in input on connection 48 is selected by multiplexer 24 and applied to the D input to the flip-flop 31. Conversely, when the scan enable signal is low (a logic 0), the next state of the flip-flop 31 is provided by the logic 14 via connection 44. The normal operation input to each of the multiplexers 24, 26, and 27 comes from the combinational logic 14 and is selected when the scan enable (SE) signal 22 is low (a logic 0). The output of the flip-flop 33 is supplied via connection 49 to a scan output pad 19. Further, the Q outputs of each flip-flop 31, 32 and 33, are supplied via connections 37, 41 and 49, respectively, as the present state to the logic 14.

Activating the scan enable signal on pad 22 forms a scan chain 15 from flip-flops 31, 32, and 33 by configuring them into a shift register. When scanning in data, successive clock pulses applied via the clock input pad 21 load each of the flip-flops 31, 32 and 33 with a known state. As each new pattern is shifted into the scan chain 15, the old pattern shifts out and is observed, thus testing the response of the IC.

To describe the operation of the scan chain 15 shown in FIG. 11B used in AC scan mode, in a first step, the scan enable signal is set to logic high and data is scanned into each of the flip-flops in the scan chain 15 on a series of successive clock cycles. The clock cycles used to scan in the data to the scan chain may be at a frequency significantly slower than the normal operating frequency of the IC 10. The primary inputs are then loaded and the primary outputs are analyzed. The scan enable signal is then lowered, and, after a brief pause, two successive clock pulses at the normal operating frequency of the integrated circuit are applied to the circuit. This type of AC scan test is referred to as a "broadside" or "system clock launch" test. Other AC scan test protocols such as "last shift launch" may alternatively be used during this launch/capture portion of the test. After the launch and capture events are complete, the scan enable signal is raised and the data is scanned out of the scan chain 15 via the pad 19 and the scan out data is analyzed. This will be described in greater detail below with respect to FIG. 1C.

FIG. 1C is a timing diagram 50 illustrating the operation of the prior art integrated circuit 10 of FIG. 1B during AC scan testing. The timing diagram 50 is divided into a scan-in period 61 a launch/capture period 62 and a scan-out period 64. The timing diagram 50 also includes a clock (CK) trace 52, a scan enable (SE) trace 54, and primary input (PI) trace 56, a primary output (PO) trace 57, a scan in (SI) trace 58, and a scan out (SO) trace 59. As shown, the clock trace 52 illustrates a series of successive clock cycles that are generated during a scan in period 61, whereby the clock pulses 52 are generated at a frequency (rate) that is significantly slower than the normal operating frequency of the integrated circuit 10 being tested. During the scan in period 61, the scan enable trace 54 indicates that the scan enable signal is at a constant logic high. During the scan-in period 61, the primary inputs generally remain constant, while the primary outputs may transition between logic low and logic high at a frequency determined by the frequency of the clock input 52. Significantly, during the scan-in period 61, the scan-in trace 58 indicates that data is being scanned-in to the registers (flip-flops) within the scan chain 15 at the rate of the clock 52. Though the scan out pad 19 will be active during the scan-in period 61, the scan-out trace 59 indicates that no measured data transitions occur at the scan-out pad 19 during the scan-in period 61 (i.e. the scan out data on pad 19 is ignored during the scan-in period in this example).

During the launch/capture period 62, the scan enable signal 54 transitions from a logic high to a logic low. The primary input trace 56 is then transitioned, thereby loading a desired value into the logic 14, which can occur before, during, or after the transition of the scan enable signal 54. In response, the primary output trace 57 transitions immediately after the primary input trace, giving rise to a period 66 during which the primary outputs can be measured for the timeliness of the response. This portion of the test identifies if there are any delay defects on paths between primary inputs and primary outputs. Though usually affecting only a small portion of most ICs, these delay defects are important because they affect what are often critical speed paths within the IC. As will be described below, a critical speed path in the IC represents the longest propagation time for a data signal traversing the logic contained within the clock domain defined by a particular clock distribution network in the IC.

At a later time within the launch/capture period 62, a pair of clock pulses 65 are provided at the normal operating frequency of the integrated circuit 10 that is being tested. The first clock pulse 67 can be referred to as the "launch" clock pulse and the second clock pulse 68 can be referred to as the "capture" clock pulse. The two successive clock pulses at the normal operating frequency of the integrated circuit allow functional testing of the logic 14 connected between the flip-flops 15 of the integrated circuit. The logic 14 generally represents a majority of the circuitry of the IC 10. A plurality of such patterns comprising scan-in, launch/capture, and scan-out periods is generally required to fully test an IC. Unfortunately, as will be described below with respect to FIG. 2, the two successive clock pulses 65 occurring at the operating frequency of the integrated circuit 10 may be subject to a delay sufficient to cause an erroneous test result to appear. Briefly, the delay is attributed to the voltage drop that occurs on the IC power supply as the launch clock pulse 67 causes switching activity in the logic 14, with the result that the current available to drive the following capture clock pulse 68 is significantly less than what is desired. This voltage drop and resulting current starvation may delay the rise of the capture clock pulse 68 to a point such that the actual test frequency that is less than the operating frequency of the integrated circuit 10, thus rendering the AC scan test inaccurate and unreliable.

The scan-out period 64 indicates that the scan enable signal 54 is again at a logic high, thus enabling the scan data to be scanned out of the scan chain 15 via pad 19 at a rate equal to the clock rate 52, which, during the scan out-period 64, is at a rate slower than the normal operating frequency of the IC 10 and similar to the scan-in clock rate.

FIG. 2 is a graphical illustration depicting the effect of voltage drop on the successive clock pulses described in FIG. 1C. The graphical illustration 70 includes an input reference clock (REF_CLK) trace 71, a clock output (CLK_312_OUT) trace 72 and a power supply voltage monitor (VDD_MONITOR) trace 74. The pair of clock pulses 76 shown in clock trace 71 are similar to the launch clock pulse 67 and the capture clock pulse 68 of FIG. 1C. For illustration purposes only, the desired reference clock frequency of the clock pulses 76 is 312.5 megahertz (MHz), which equates to a clock cycle time of 3.2 nanoseconds (ns) for each clock pulse. The clock output trace 72 is responsive to the reference clock input trace 71 and is shown using trace 78. Trace 78 represents the response of the on-chip clock distribution network to the input reference, clock pulses, and thus includes a first pulse 79 and a second pulse 80, both of which reflect the insertion delay relative to the reference clock pulses which caused them. The first pulse 79 results from the first pulse 75 of the reference clock 71 and the second pulse 80 results from the second reference clock pulse 77. However, the second clock pulse 80 has an additional delay beyond that due to insertion delay. As shown, the original reference clock period of 3.2 ns has elongated to 3.7 ns after the pulses propagate through the clock distribution network on the integrated circuit 10 (FIG. 1A).

The power supply voltage monitor trace 74 includes a curve 81, which illustrates the clock period elongation described above. The curve 81 begins at a voltage level of 1.8 volts (V) and, upon the initiation of the clock pulse 79, indicates that the voltage begins to drop from 1.8 V down to approximately 1.54 V during the second clock pulse 80. The degradation of the supply voltage (i.e., the voltage drop) from 1.8 V to 1.54 V renders the IC incapable of providing adequate current to drive the second rising clock edge in a timely fashion and thus gives rise to the clock period elongation, whereby the clock period beginning at the rising edge of pulse 79 to the rising edge of pulse 80 has been elongated to 3.7 ns. Remember that the input clock frequency of 312.5 MHz corresponds to a clock period of 3.2 ns. The 3.7 ns clock period of the output clock 72 corresponds to approximately 270 MHz clock frequency. Therefore, the voltage drop, as shown by the voltage trace 81, turns a 312.5 MHz input clock into a 270 MHz output clock. This causes the testing of the integrated circuit device 10 to occur at a frequency significantly below the desired frequency.

Therefore, it will be desirable to have a way to measure and compensate for delay caused by clock period elongation resulting from supply voltage drop during scan testing of an integrated circuit.

SUMMARY

Embodiments of the apparatus and method for compensating clock period elongation during scan testing in an integrated circuit include operating a clock associated with the IC at a frequency ($f_{TARGET}$) at which IC operation is sought to be determined, measuring the actual clock period ($T_{CLOCK\_OUT}$) at a clock output, scan testing the IC, measuring the actual clock period ($T_{SCAN\_CLOCK\_OUT}$) at the clock output, determining a delay by calculating the difference between $T_{SCAN\_CLOCK\_OUT}$ and $T_{CLOCK\_OUT}$, and compensating for the delay by increasing the clock frequency during scan test.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The circuit and method for comparing circuit performance between functional and AC scan testing in an integrated circuit can be better understood with reference to the following figures. The components within the figures are not necessarily to scale, emphasis instead being placed upon clearly illustrating the principles of the system and method. Moreover, in the figures, like reference numerals designate corresponding parts throughout the different views.

DETAILED DESCRIPTION

The apparatus and method for compensating clock period elongation during scan testing in an integrated circuit, to be described in detail below, can be implemented, integrated and performed on any existing integrated circuit. Further, multiple iterations of the apparatus and method for compensating clock period elongation during scan testing in an integrated circuit can be implemented on an integrated circuit. While the apparatus and method for compensating clock period elongation during scan testing in an integrated circuit will be described below using specific hardware elements, modules and devices, the apparatus can be implemented using a variety of different technology and the method can be performed on any integrated circuit.

Figure 1A:
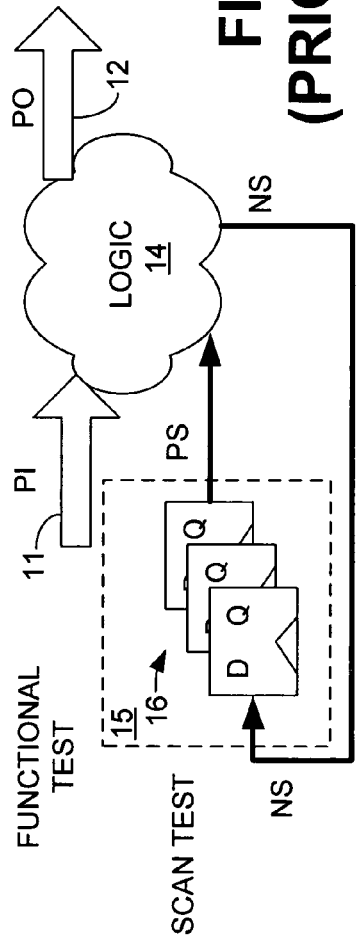
FIG. 1A is a block diagram illustrating a simplified prior art integrated circuit.
Figure 1B:
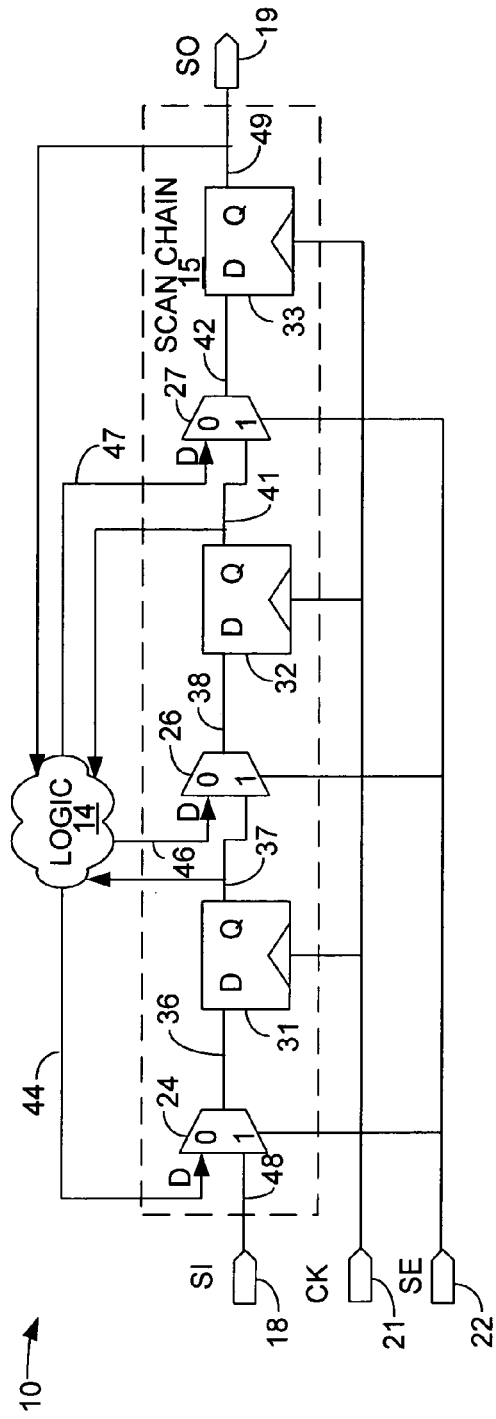
FIG. 1B is a block diagram illustrating in further detail the integrated circuit 10 of FIG. 1A.
Figure 1C:
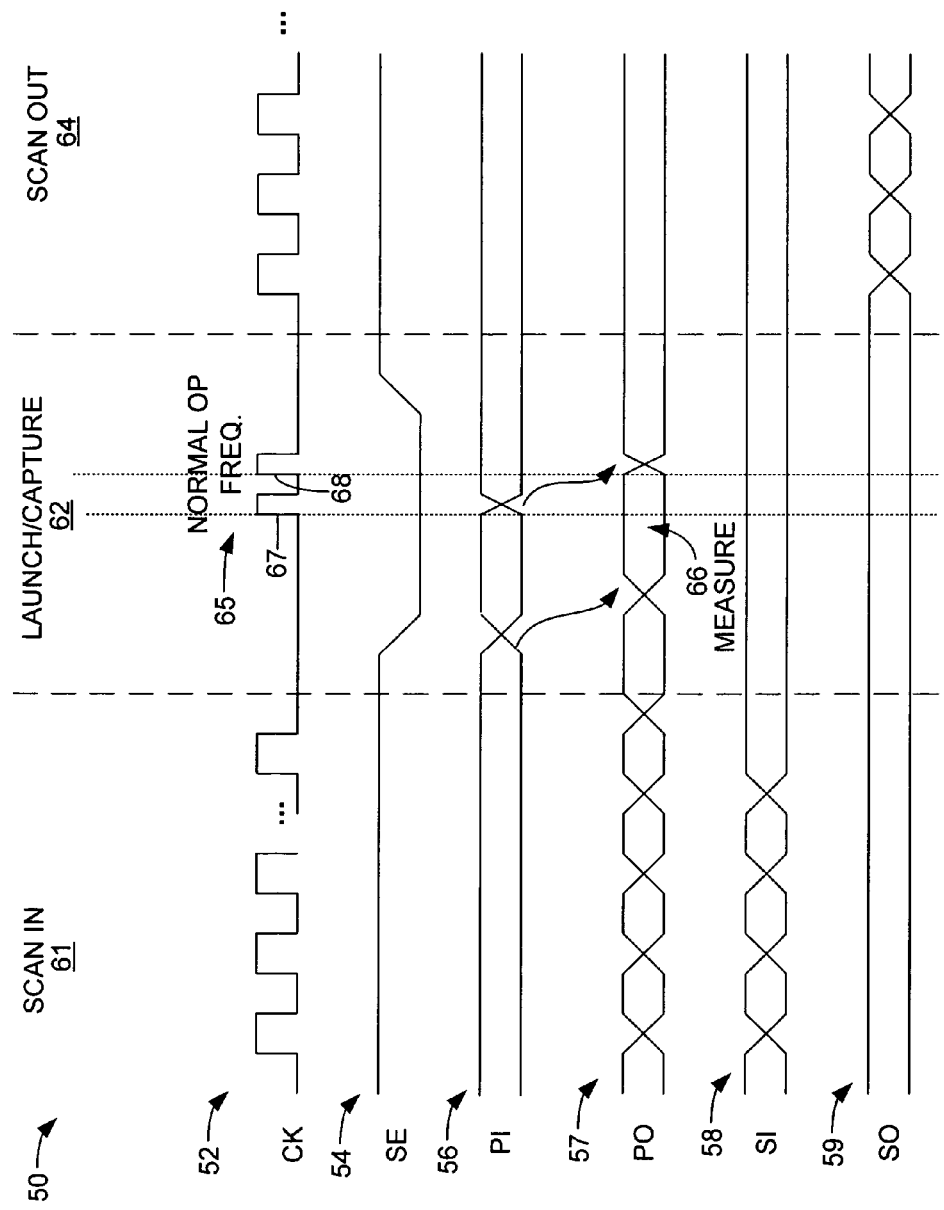
FIG. 1C is a timing diagram illustrating the operation of the prior art integrated circuit 10 of FIG. 1B during AC scan testing.
Figure 2:
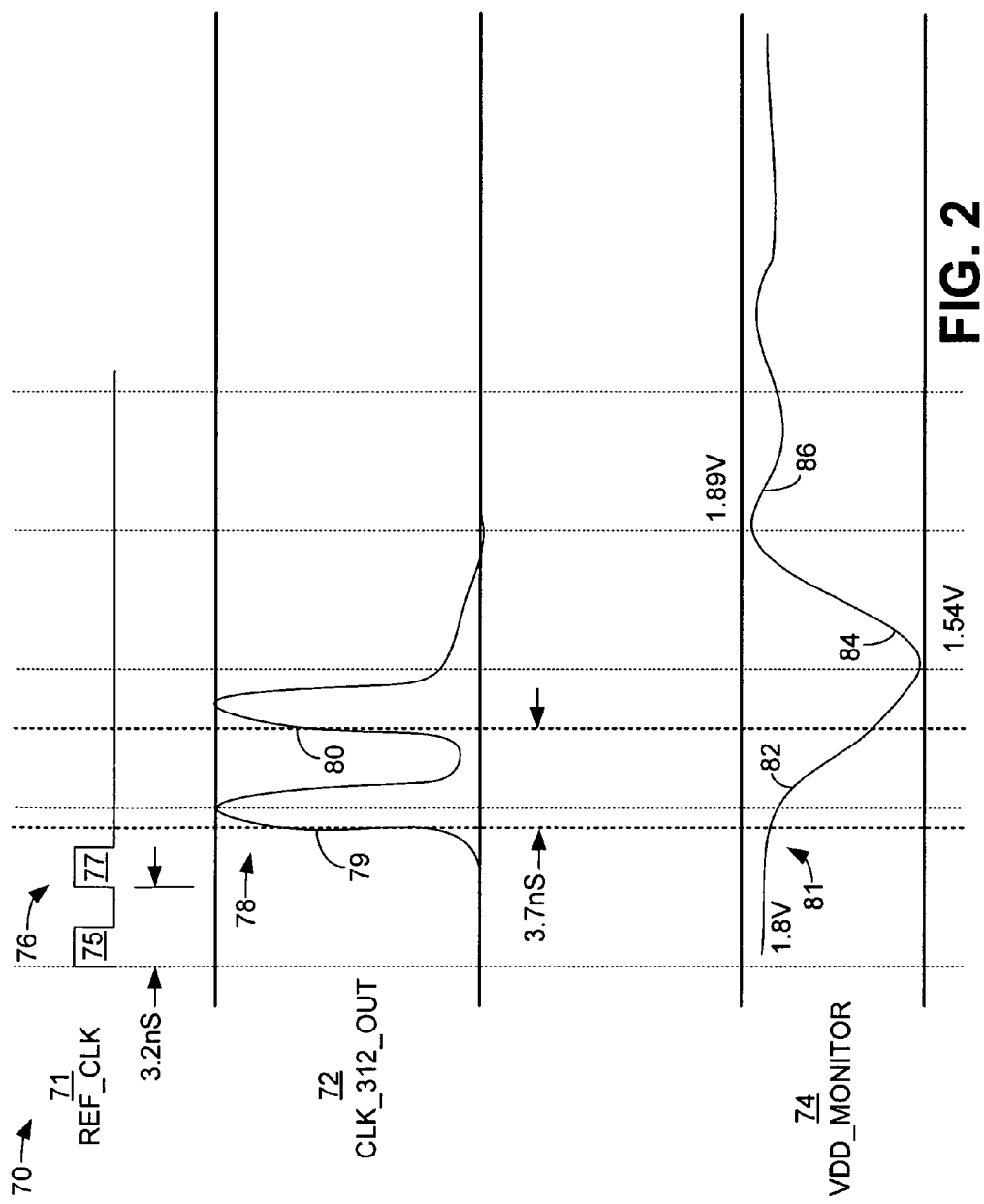
FIG. 2 is a graphical illustration depicting the effect of voltage drop on the successive clock pulses described in FIG. 1C.
Figure 3:
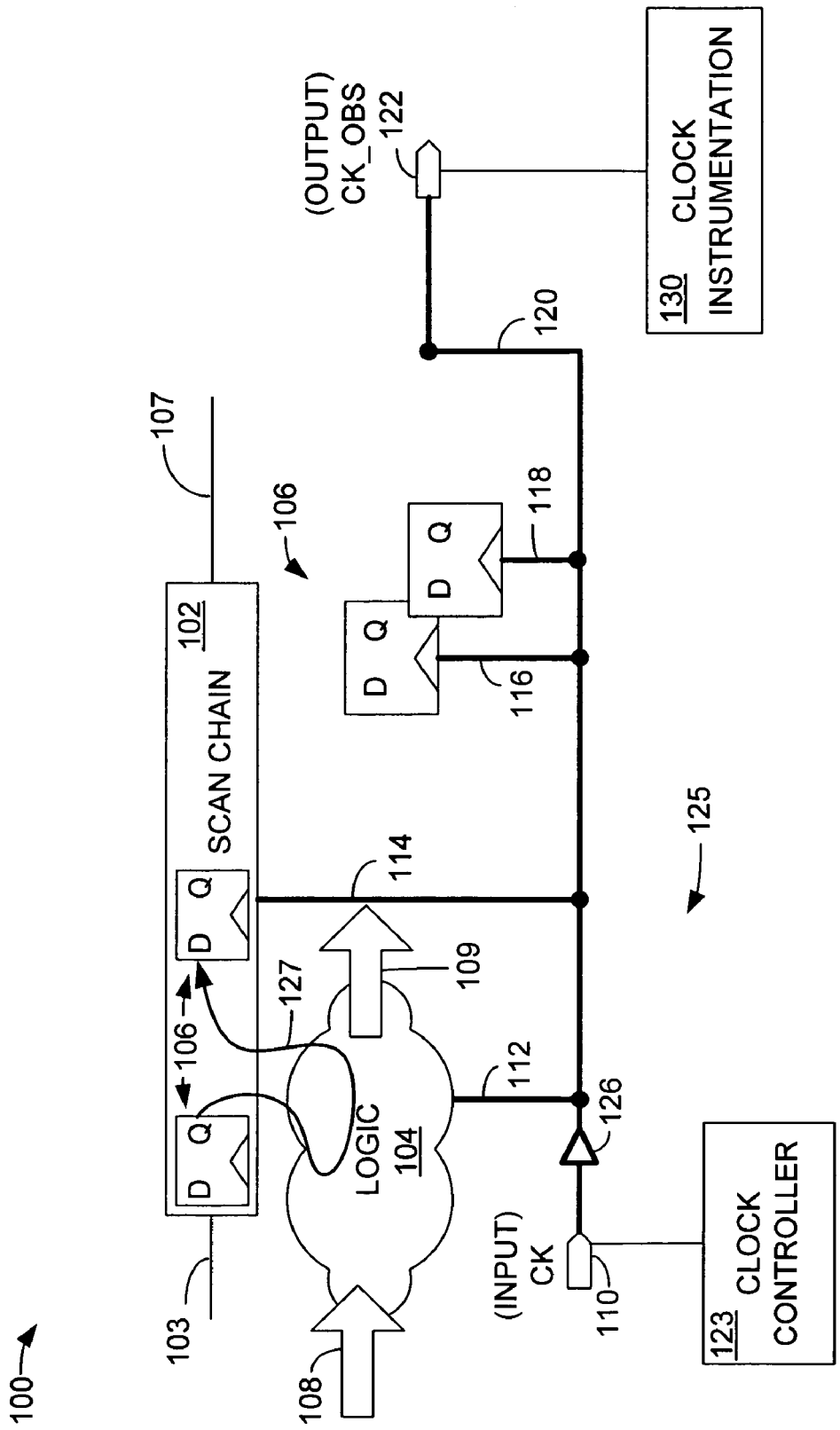
FIG. 3 is a block diagram illustrating an integrated circuit (IC).

FIG. 3 is a block diagram illustrating the basic components of an integrated circuit 100. The IC 100 includes a plurality of scan chains, one of which is illustrated at 102, a plurality of logic gates, referred to at 104, and a plurality of other flip-flops, referred to at 106. The logic 104 receives primary input(s) via connection 108 and provides primary output(s) via connection 109. The logic 104, scan chain 102 and flip-flops 106 receive a clock signal from a clock input (CK) pad 110 via a clock distribution network 125, shown in bold. The clock signal from the pad 110 is typically buffered, shown using an exemplary repeater 126, as it is supplied to the logic 104, scan chain 102 and flip-flops 106 via connections 112, 114, 116 and 118. In one embodiment, the clock distribution network 125 is coupled via connection 120 to a clock observation (CK_OBS) pad 122.

In one embodiment, the frequency of the clock signal supplied via connection 110 is controllable via a clock controller 123, such as a signal generator or a piece of automated test equipment. The clock controller 123 adjusts the frequency of the input clock signal depending on the delay of the clock signal through the IC 100 and to compensate for clock period elongation resulting from supply voltage drop as successive clock input pulses propagate through the IC 100. In one embodiment, a clock instrumentation element 130 is coupled to the clock observation pad 122 to measure the frequency and the period of the clock signal after propagating through the IC 100. In this embodiment, the clock distribution network 125 is externally visible with respect to the IC 100.

The logic 104 includes what is referred to as a "critical path" 127, which begins at a Q-output of a flip-flop in the scan chain 102, progresses through a plurality of logic gates within the logic 104, and ends at a D-input of a flip-flop in the scan chain 102. The critical path 127 represents the longest propagation time for a data signal traversing the logic 104 contained within the clock domain defined by the clock distribution network 125. Though FIG. 3 illustrates only a single clock domain, an IC may contain a plurality of clock domains, each having a clock distribution network, scan chains, and logic containing unique critical paths. It should be noted that the actual number of branches of a clock distribution network is quite large on a large IC, driving possibly hundreds of thousands or millions of subcircuits. The performance of this clock network may differ depending upon the type of test being performed.

Figure 4:
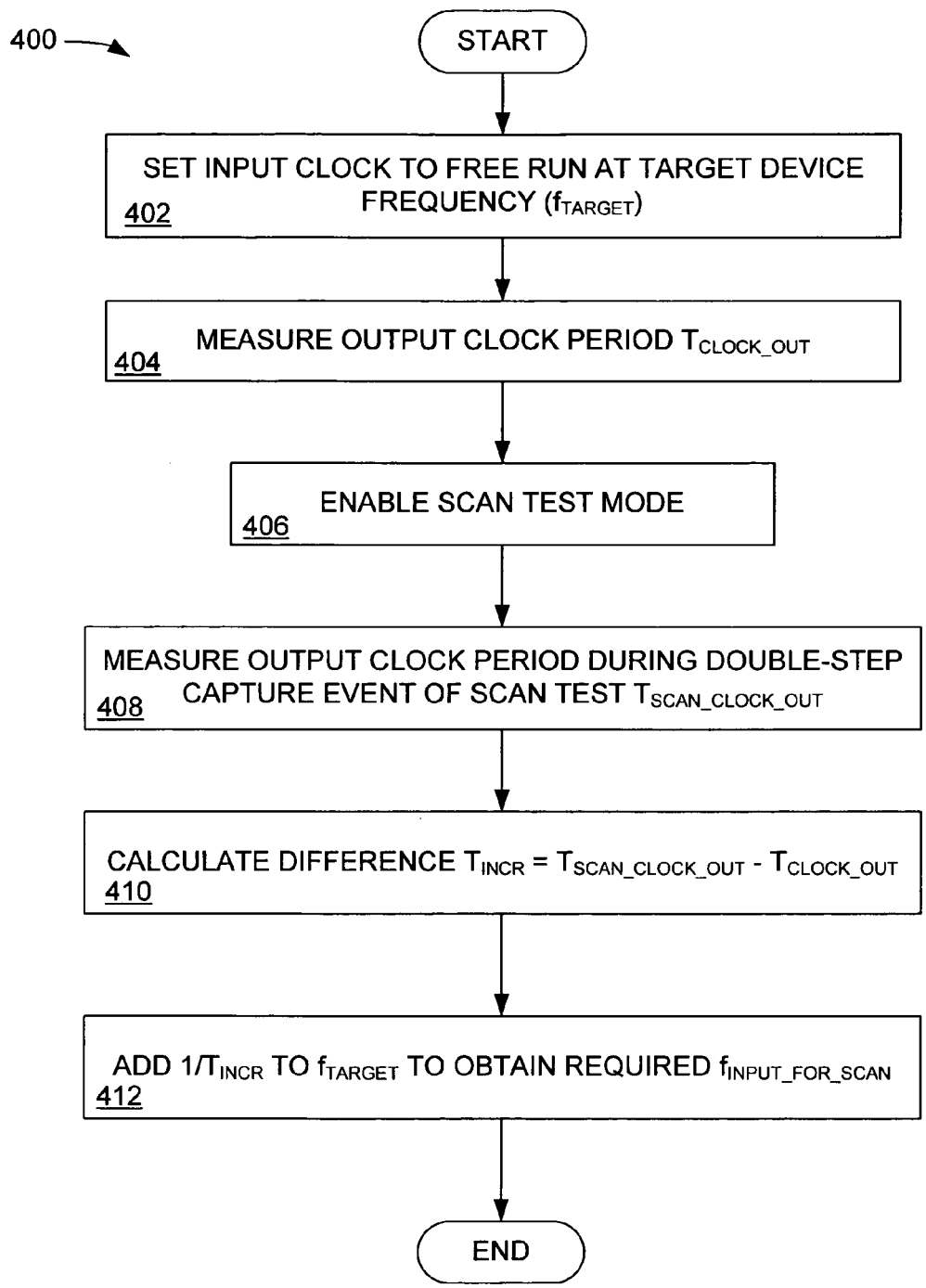
FIG. 4 is a flowchart illustrating an embodiment of the method for compensating clock period elongation during scan testing in an integrated circuit.

FIG. 4 is a flowchart 400 illustrating an embodiment of the method for compensating clock period elongation during scan testing in an integrated circuit. The blocks in the flowcharts to follow are representative of the operation of the invention and need not be performed in the order shown. The blocks may be performed concurrently, or out of the order shown. In block 402 the system clock associated with the integrated circuit under test is set to run at the target operating frequency of the IC 100. The target operating frequency of the IC 100 is referred to as $f_{TARGET}$. For example, if the IC 100 is rated to have a 312.5 MHz operating frequency, then the system clock referred to in block 402 is set to run at a frequency of 312.5 MHz. Next, in block 404, the actual period of the output clock is measured via external instrumentation connected to the clock observation pad 122 (FIG. 3). This value is called $T_{CLOCK\_OUT}$ and can be measured directly using the clock instrumentation element 130. Alternatively, the frequency, referred to as $f_{FUNCTIONAL}$ can be measured by the clock instrumentation element 130. The period, $T_{CLOCK\_OUT}$, of the output clock signal can then be computed as $1/f_{FUNCTIONAL}$. It is expected that the steady-state value of the frequency measured at the output clock observation pad 122, $f_{FUNCTIONAL}$, is equal to the frequency of the input clock 110, $f_{TARGET}$. There may be transient effects when the clock is first started, so this measurement is performed after some large number of clock cycles have been applied.

In block 406, scan test mode is enabled for the IC 100. Scan test mode is typically enabled by halting the propagation of the clock signal through the clock distribution network 125, either by suspending the input clock 110 or by preventing the input clock 110 from propagating through the clock distribution network 125. In block 408, exactly two clock pulses are applied to the clock distribution network 125 and observed on output clock pad 122 using the clock instrumentation element 130. The frequency of the output clock (which is the inverse of the time period between rising (or falling) edges of the two pulses) is called $f_{SCAN}$, and is likely to be lower than the intended value of $f_{TARGET}$ due to the elongation of the clock period as described above. The period, $T_{SCAN\_CLOCK\_OUT}$, is computed as $1/f_{SCAN}$.

In block 410, the difference between these two measurements is taken to compute the incremental period difference $T_{NCR}=T_{SCAN\_CLOCK\_OUT}-T_{CLOCK\_OUT}$. This incremental period $T_{INCR}$ corresponds to the amount of frequency compensation necessary to compensate for the clock period elongation during scan testing. For example, $1/T_{INCR}$ represents the amount of frequency compensation $f_{INCR}$ required to compensate for clock period elongation caused by the scan test. Block 412 shows that the proper frequency at which to apply a scan test, $f_{INPUT\_FOR\_SCAN}$, is the sum of $f_{TARGET}$ and $f_{INCR}$ ($1/T_{INCR}$). By applying the scan test with an input clock frequency adjusted using the clock controller 123 (FIG. 3) to be higher than $f_{TARGET}$, the actual frequency appearing at the clock distribution network 125 after clock period elongation will be $f_{TARGET}$.

The stimulus and response of the IC 100 during the measurements of $f_{FUNCTIONAL}$ ($1/T_{CLOCK\_OUT}$) and $f_{SCAN}$ ($1/T_{SCAN\_CLOCK\_OUT}$) should ideally be representative of the actual test activity of the same circuitry by each type of test (functional and scan, respectively). In other words, the same functional and scan test patterns should be applied to the same portions of the IC 100. Specifically, these measurements should be taken during the application of each respective type of test, and ideally the tests should exercise the same circuitry within the IC 100.

During a functional test, a continuous stream of clock pulses is applied to the IC 100 via the clock input pin 110, along with stimulus to the primary input 108 (FIG. 3). The internal state of the IC 100, as defined by the values in the flip-flops in the logic 104, progresses through a sequence of values dictated by the logic 104 and the external stimulus applied to the primary input 108. Various paths through the internal logic 104 are exercised during this sequence, including the critical path 127, as shown in FIG. 3. The response of the IC 100 to a functional test is monitored continuously on the primary output 109. If the clock rate at which the functional test is applied exceeds the performance capability as defined by the critical path 127, then the internal state of the IC 100 will diverge from the expected value. A properly written functional test will ultimately propagate this state divergence to the primary output 109, at which time the failure of the functional test can be observed.

During a scan-based delay test, a specific state is shifted into the flip-flops 106 directly, then a pair of clock pulses are driven into the clock input pin 110. This scan pattern can be designed such that it sensitizes the critical path 127 shown in FIG. 3. The response of the IC 100 to this scan pattern is captured and held in the flip-flops 106, which may then be examined by shifting out their contents via the scan chain 102 via connection 107. If the clock period used during the pair of clock pulses was too short to allow the critical path 127 to respond in time, then the flip-flop at the destination end of the critical path 127 will contain the wrong value and the scan test failure will be observed when the scan chain is shifted out via connection 107. Since both the functional test and the scan test are exercising the same critical path 127 in the IC 100, the comparison of the clock rates at which each respective test first failed will indicate the relationship of the actual clock periods as experience by the internal logic in the IC 100.

In situations where full functional testing is not possible, then the use of built-in-self-test (BIST) circuitry running at full clock speed on the IC 100 is an acceptable alternative. The corresponding scan test should exercise the same critical path(s) within the IC 100 that are exercised by the BIST circuitry.

Figure 5:
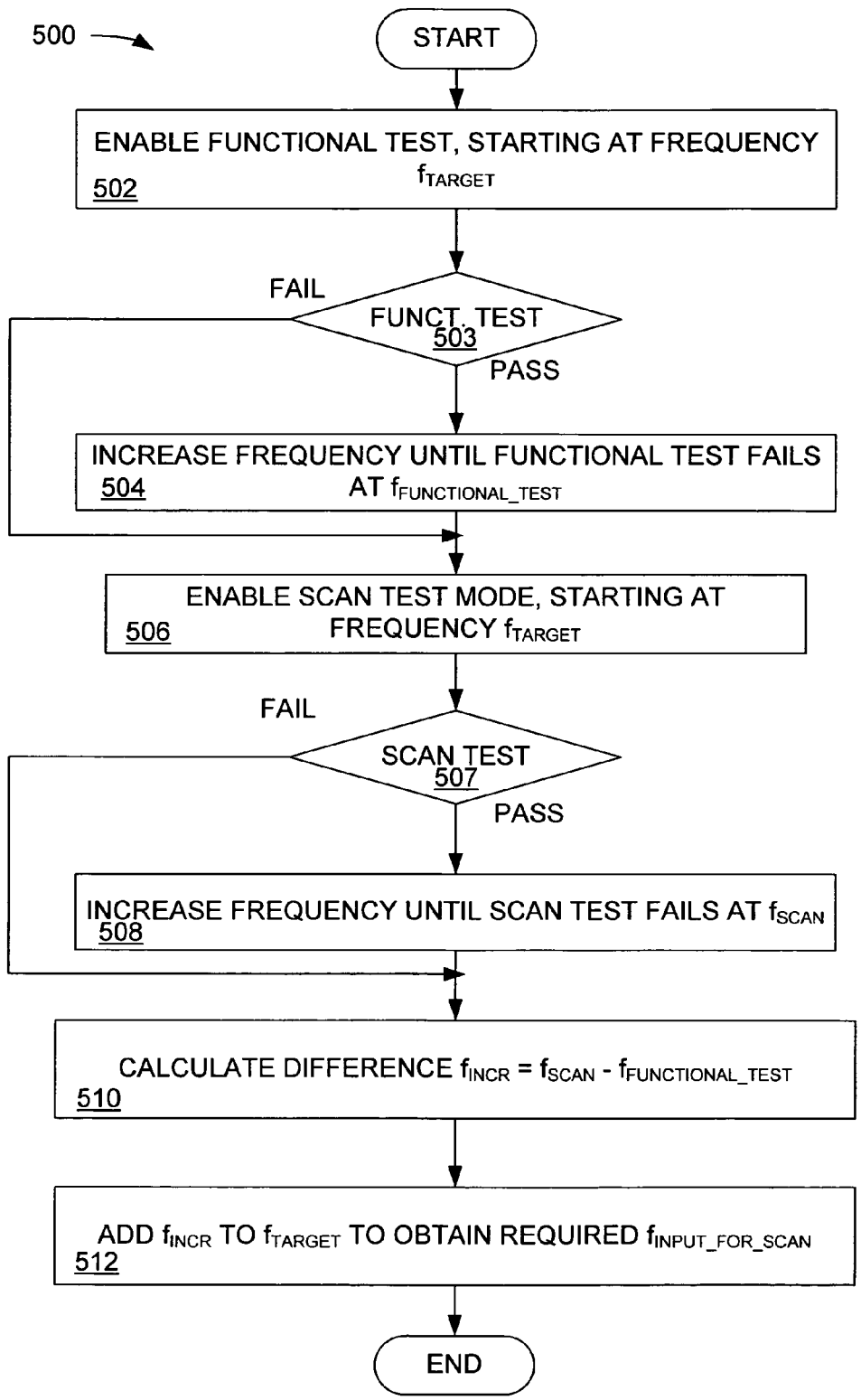
FIG. 5 is a flowchart illustrating an alternative embodiment of the method for compensating clock period elongation during scan testing in an integrated circuit.

FIG. 5 is a flowchart 500 illustrating an alternative embodiment of the method for compensating clock period elongation during scan testing in an integrated circuit when a clock observation pad 122 (FIG. 3) is unavailable. In block 502, a functional test (or BIST tests) is enabled on the IC. 100 with the input clock (110 of FIG. 3) set to run at the target operating frequency $f_{TARGET}$ of the IC 100. In block 503, a functional test is performed. If the functional test passes, then, in block 504, the frequency at which the functional test (or BIST test) is applied is increased and the functional test is performed again. This continues until the functional test fails. The last frequency at which the functional test passes is referred to as $f_{FUNTIONAL\_TEST}$. This frequency indicates the upper clock frequency limit for the IC 100 in functional test mode.

In block 506, scan test mode is enabled for the IC 100. In block 507 a scan test is performed at the target frequency $f_{TARGET}$, of the IC 100. IF the scan test passes, then, in block 508, the frequency of the input clock signal is increased and the IC 100 again undergoes scan test in block 507. This continues until the scan test fails. The last frequency at which the scan test passes is referred to as $f_{SCAN}$ and indicates the upper clock frequency limit for the IC 100 in scan test mode. It is likely that $f_{SCAN}$ will be greater than $f_{FUNCTIONAL}$ due to the elongation of the clock period described above. In other words, the circuit under test will appear to run faster in scan test mode than it does in functional mode. In block 510, the difference between $f_{SCAN}$ and $f_{FUNCTIONAL\_TEST}$ is determined to compute the incremental frequency difference $f_{INCR}=F_{SCAN}-f_{FUNCTIONAL\_TEST}$. The incremental frequency $f_{INCR}$ represents the amount of frequency compensation to compensate for the clock period elongation during scan testing. Block 512 shows that the proper frequency at which to apply a scan test, $f_{INPUT\_FOR\_SCAN}$, is the sum of $f_{TARGET}$ and $f_{INCR}$. By applying the scan test with an input clock frequency adjusted using the clock controller 123 (FIG. 3) to be higher than $f_{TARGET}$, the actual frequency of the clock distribution network 125 after clock period elongation will be $f_{TARGET}$. Since, in this embodiment, the determination of the proper frequency adjustment is inferred by the results of actual performance testing (instead of direct measurement on the actual clock output pad), it is important that the functional and scan tests target the same circuitry on the IC 100. The difference between $f_{SCAN}$ and $f_{FUNCTIONALTEST}$ indicates the amount of clock delay due to supply voltage drop, and the circuitry affected by the voltage drop should be consistent across the two tests. The accurate determination of the two clock frequencies $f_{FUNCTIONAL\_TEST}$ and $f_{SCAN}$ on the same portion of the circuitry allows a scan test frequency to be chosen that will test the IC 100 at its designed clock speed.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A method for compensating clock period elongation during scan testing in an integrated circuit (IC), comprising:
   operating a clock associated with the IC at a frequency ($f_{TARGET}$) at which IC operation is sought to be determined;
   measuring an actual clock period ($T_{CLOCK\_OUT}$) during the operating step by observing a clock output signal at an externally observable clock output pad;
   scan testing the IC;
   measuring an actual clock period ($T_{SCAN\_CLOCK\_OUT}$) during the scan testing by observing the clock output signal at the externally observable clock output pad;
   determining a delay by calculating the difference between the $T_{SCAN\_CLOCK\_OUT}$ and the $T_{CLOCK\_OUT}$; and
   compensating for the delay by increasing the clock frequency during the scan testing using an externally controllable clock input signal.

2. The method of claim 1, further comprising testing specific circuitry on the IC using the functional testing and the scan testing.

3. The method of claim 2, further comprising testing the same circuitry on the IC using the functional testing and the scan testing.

4. The method of claim 3, wherein the functional testing utilizes built-in-self-test circuitry.

5. A method for compensating clock period elongation during scan testing in an integrated circuit (IC), comprising:
   operating a clock associated with the IC at a frequency ($f_{TARGET}$) at which IC operation is sought to be determined;
   functional testing the IC to determine a frequency corresponding to a functional test pass/fail boundary ($f_{FUNCTIONAL\_TEST}$);
   scan testing the IC to determine the highest clock frequency ($f_{SCAN}$) at which the IC passes the scan test;
   determining a delay by calculating the difference between the $f_{SCAN}$ during the scan testing and the $f_{FUNCTIONAL\_TEST}$ during the functional testing; and
   compensating for the delay by increasing the clock frequency during the scan testing using an externally controllable clock input signal.

6. The method of claim 5, further comprising testing specific circuitry on the IC using the functional testing and the scan testing.

7. The method of claim 6, further comprising testing the same circuitry on the IC using the functional testing and the scan testing.

8. The method of claim 7, wherein the functional testing uses built-in-self-test circuitry.

* * * * *